US012007187B1

(12) United States Patent
Thiesen et al.

(10) Patent No.: US 12,007,187 B1
(45) Date of Patent: Jun. 11, 2024

(54) MONITORING ENERGY DISCHARGE IN A FIRE CONTROL SYSTEM

(71) Applicant: Biofire Technologies Inc., Broomfield, CO (US)

(72) Inventors: Jack Hugo Thiesen, Firestone, CO (US); Karl Fredrick Brakora, Spring Lake, MI (US); Kai Thorin Kloepfer, Denver, CO (US)

(73) Assignee: Biofire Technologies Inc., Broomfield, CO (US)

( * ) Notice: Subject to any disclaimer, the term of this patent is extended or adjusted under 35 U.S.C. 154(b) by 113 days.

(21) Appl. No.: 17/813,431

(22) Filed: Jul. 19, 2022

Related U.S. Application Data

(60) Provisional application No. 63/223,280, filed on Jul. 19, 2021.

(51) Int. Cl.
*F41A 19/60* (2006.01)
*F41A 19/59* (2006.01)
*G01R 29/24* (2006.01)

(52) U.S. Cl.
CPC .............. *F41A 19/60* (2013.01); *F41A 19/59* (2013.01); *G01R 29/24* (2013.01)

(58) Field of Classification Search
CPC .......... G01R 29/24; F41A 19/59; F41A 19/60; F41A 19/58; F41A 19/61; F41A 19/62; F41A 19/63; F41A 19/70; F41A 19/69
USPC ...................................................... 42/69.01
See application file for complete search history.

(56) References Cited

U.S. PATENT DOCUMENTS

| | | | | |
|---|---|---|---|---|
| 4,047,591 A | * | 9/1977 | Ward | G01V 1/137 181/107 |
| 4,838,142 A | * | 6/1989 | Birk | F41A 1/04 89/7 |
| RE38,794 E | * | 9/2005 | Danner | F41A 19/70 42/84 |
| 8,322,329 B1 | * | 12/2012 | Sikes | F41B 11/723 124/73 |
| 2005/0017456 A1 | * | 1/2005 | Shechter | F41J 5/14 273/371 |

(Continued)

FOREIGN PATENT DOCUMENTS

| | | | | |
|---|---|---|---|---|
| CA | 2881982 A1 | * | 2/2014 | .............. F41C 27/00 |
| CA | 3066787 A1 | * | 4/2019 | .......... F21V 23/0407 |

*Primary Examiner* — John Cooper
(74) *Attorney, Agent, or Firm* — Perkins Coie LLP; Andrew T. Pettit

(57) ABSTRACT

The present disclosure provides systems and techniques for monitoring the transfer of electric charge and determining whether a threshold amount of electric charge has been transferred. Aspects of the present disclosure may be performed by a fire control system, and the fire control system may be implemented in a gun. The fire control system may generate an integrated voltage using an integrator to integrate a current induced voltage that is present across a resistor, compare the integrated voltage against a reference voltage to determine whether the integrated voltage exceeds the reference voltage, and generate an output voltage that indicates whether the integrated voltage exceeds the reference voltage. The output voltage may be generated based on comparing the integrated voltage against the reference voltage using a comparator circuit, and the reference voltage may correspond to a threshold amount of electric charge.

22 Claims, 11 Drawing Sheets

(56) References Cited

U.S. PATENT DOCUMENTS

| | | | |
|---|---|---|---|
| 2010/0031552 A1* | 2/2010 | Houde-Walter | F41C 23/16 |
| | | | 42/72 |
| 2013/0104868 A1* | 5/2013 | Sikes | F41B 11/724 |
| | | | 124/71 |
| 2018/0356178 A1* | 12/2018 | Chu | F41B 11/71 |

* cited by examiner

MONITORING ENERGY DISCHARGE IN A FIRE CONTROL SYSTEM

CROSS-REFERENCE TO RELATED APPLICATIONS

This application claims priority to U.S. Provisional Application No. 63/223,280, titled "MONITORING ENERGY DISCHARGE IN A FIRE CONTROL SYSTEM" and filed on Jul. 19, 2021, which is incorporated by reference herein in its entirety.

FIELD OF TECHNOLOGY

The teachings disclosed herein generally relate to guns, and more specifically to a gun that includes an electronic fire control system.

BACKGROUND

The term "gun" generally refers to a ranged weapon that uses a shooting tube (also referred to as a "barrel") to launch solid projectiles, though some instead project pressurized liquid, gas, or even charged particles. These projectiles may be free flying (e.g., as with bullets), or these projectiles may be tethered to the gun (e.g., as with spearguns, harpoon guns, and electroshock weapons such as TASER® devices). The means of projectile propulsion vary according to the design (and thus, type of gun), but are traditionally effected pneumatically by a highly compressed gas contained within the barrel. This gas is normally produced through the rapid exothermic combustion of propellants (e.g., as with firearms) or mechanical compression (e.g., as with air guns). When introduced behind the projectile, the gas pushes and accelerates the projectile down the length of the barrel, imparting sufficient launch velocity to sustain it further towards a target after exiting the muzzle.

Most guns use compressed gas that is confined by the barrel to propel the projectile up to high speed, though the term "gun" may be used more broadly in relation to devices that operate in other ways. Accordingly, the term "gun" may not only cover handguns, shotguns, rifles, single-shot firearms, semi-automatic firearms, and automatic firearms, but also electroshock weapons, light-gas guns, plasma guns, and the like.

Significant energies have been spent developing safer ways to use, transport, store, and discard guns. Gun safety is an important aspect of avoiding unintentional injury due to mishaps like accidental discharges and malfunctions. Gun safety is also becoming an increasingly important aspect of designing and manufacturing guns. While there have been many attempts to make guns safer to use, transport, and store, those attempts have had little impact.

SUMMARY

The systems and techniques described herein support monitoring aspects of a fire control system of a gun. The term "gun," as used herein, may be used to refer to a lethal force weapon, such as a pistol, a rifle, a shotgun, a semi-automatic firearm, or an automatic firearm; a less-lethal weapon, such as a stun-gun or a projectile emitting device; or an assembly of components operable to selectively discharge matter or charged particles, such as a firing mechanism.

Generally, the systems and techniques described herein provide for monitoring the transfer of electric charge within a fire control system. In some examples, the fire control system may be implemented in a gun. The fire control system may generate an integrated voltage using an integrator to integrate a current induced voltage that is present across a resistor, compare the integrated voltage against a reference voltage to determine whether the integrated voltage exceeds the reference voltage, and generate an output voltage that indicates whether the integrated voltage exceeds the reference voltage. The output voltage may be generated based on comparing the integrated voltage against the reference voltage using a comparator circuit, and the reference voltage may correspond to a threshold amount of electric charge.

Figure 1:
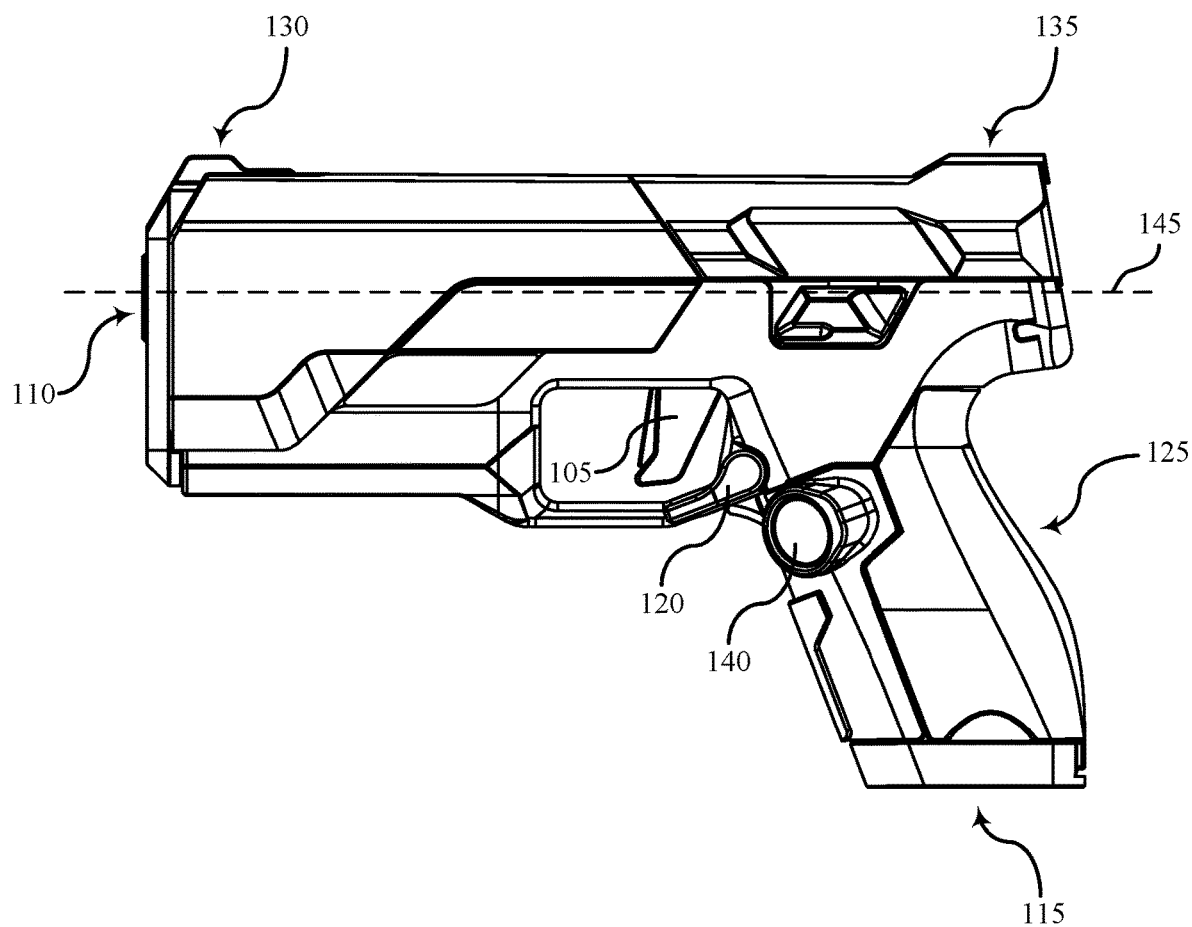
FIG. 1 illustrates an example of a gun that is capable of monitoring the transfer of electric charge.

Various features of the technology described herein will become more apparent to those skilled in the art from a study of the Detailed Description in conjunction with the drawings. Various embodiments are depicted in the drawings for the purpose of illustration. However, those skilled in the art will recognize that alternative embodiments may be employed without departing from the principles of the technology. Accordingly, the technology is amenable to modifications that may not be reflected in the drawings.

DETAILED DESCRIPTION

Some conventional fire control systems include features that are powered by electricity. For example, some conventional fire control systems include electromechanical components that are displaced in response to electric current being directed through a solenoid. However, conventional systems fail to monitor the flow of electric charge in real time, which can lead to system errors or failures. For example, a conventional system may direct too little electric charge through the solenoid, resulting in a failure to displace an electromechanical actuator and a failure to fire a projectile from the fire control system.

Introduced here, therefore, are systems and techniques for monitoring energy discharge in a fire control system. The fire control system may be an aspect of a weapon, such as an electromechanical gun, and activating the fire control system may result in the weapon firing a projectile. The fire control system may include an energy store, such as a capacitor bank including one or more capacitors, and energy may be released from the energy store by discharging electric charge. The fire control system may include an integrator (e.g., an operational amplifier (op-amp) integrator) that integrates a voltage present across a resistor and a comparator (e.g., an op-amp comparator) that compares the integrated voltage against a reference voltage. The integrated voltage may be referred to as "$V_{IN}$" and the reference voltage may be referred to as "$V_{REF}$". The integrated voltage is proportional to the electric current that passes through the resistor during a period of time, so the integrated voltage may be used to determine the amount of electrical charge that has passed through the resistor during the period of time for which the voltage is integrated. In other words, the integrated voltage indicates the amount of electric charge that has been discharged, and the integrated voltage may be compared against the reference voltage to determine whether a threshold amount of electric charge has been discharged.

The fire control system may perform one or more actions based on comparing the integrated voltage against the reference voltage. For example, if the integrated voltage exceeds the reference voltage, the fire control system may reset a latch or a flip-flop, predict a successful fire, store an indication of a successful discharge (e.g., generate or modify a log file), or recharge the energy store with electric charge. If the integrated voltage does not exceed the reference voltage, the fire control system may transition to a safe state, modify the energy store (e.g., connect the capacitors of the energy store in parallel), decrease the voltage of the energy store, identify an error, or store an indication of an unsuccessful discharge (e.g., generate or modify a log file).

Using the integrator to calculate the amount of discharged electric charge and the comparator to determine whether a threshold amount of electric charge has been discharged allows the fire control system to determine whether the amount of discharged electric charge satisfies a threshold condition and/or whether a discharge error has occurred. Using hardware components, such as an op-amp integrator and an op-amp comparator, reduces system latency and increases system reliability. For example, some systems may include software that aids in monitoring the discharge of electric charge, but such software-mediated processes may be associated with higher latency than systems that use hardware components to monitor the discharge of electric charge.

Embodiments may be described in the context of executable instructions for the purpose of illustration. For example, a processor housed in a gun may be described as being capable of executing instructions that facilitate the charging, discharging, and monitoring of an energy store, such as a capacitor bank. However, those skilled in the art will recognize that aspects of the technology could be implemented via hardware, firmware, or software.

Terminology

References in the present disclosure to "an embodiment" or "some embodiments" means that the feature, function, structure, or characteristic being described is included in at least one embodiment. Occurrences of such phrases do not necessarily refer to the same embodiment, nor are they necessarily referring to alternative embodiments that are mutually exclusive of one another.

Unless the context clearly requires otherwise, the terms "comprise," "comprising," and "comprised of" are to be construed in an inclusive sense rather than an exclusive or exhaustive sense (i.e., in the sense of "including but not limited to"). The term "based on" is also to be construed in an inclusive sense rather than an exclusive or exhaustive sense. For example, the phrase "A is based on B" does not imply that "A" is based solely on "B." Thus, the term "based on" is intended to mean "based at least in part on" unless otherwise noted.

The terms "connected," "coupled," and variants thereof are intended to include any connection or coupling between two or more elements, either direct or indirect. The connection or coupling can be physical, electrical, logical, or a combination thereof. For example, elements may be electrically or communicatively coupled with one another despite not sharing a physical connection. As one illustrative example, a first component is considered coupled with a second component when there is a conductive path between the first component and the second component. As another illustrative example, a first component is considered coupled with a second component when the first component and the second component are fastened, joined, attached, tethered, bonded, or otherwise linked.

The term "manager" may refer broadly to software, firmware, or hardware. Managers are typically functional components that generate one or more outputs based on one or more inputs. A computer program may include or utilize one or more managers. For example, a computer program may utilize multiple managers that are responsible for completing different tasks, or a computer program may utilize a single manager that is responsible for completing all tasks. As another example, a manager may include an electrical circuit that produces an output based on hardware components, such as transistors, logic gates, analog components, or digital components. Unless otherwise noted, the terms "manager" and "module" may be used interchangeably herein.

When used in reference to a list of multiple items, the term "or" is intended to cover all of the following interpretations: any of the items in the list, all of the items in the list, and any combination of items in the list. For example, the list "A, B, or C" indicates the list "A" or "B" or "C" or "A and B" or "A and C" or "B and C" or "A and B and C."

Overview of Guns

FIG. 1 illustrates an example of a gun 100 that includes a fire control system capable of monitoring energy discharge. The gun 100 includes a trigger 105, a barrel 110, a magazine 115, and a magazine release 120. While these components are generally found in firearms, such as pistols, rifles, and shotguns, those skilled in the art will recognize that the technology described herein may be similarly applicable to other types of guns as discussed above. As an example, comparable components may be included in vehicle-mounted weapons that are not intended to be held or operated by hand. While not shown in FIG. 1, the gun 100 may also include a striker (e.g., a ratcheting striker or rotating striker) or a hammer that can be actuated in response to pulling the trigger 105. Pulling the trigger 105 may result in the release of the striker or hammer, thereby causing the striker or hammer to contact a firing pin, percussion cap, or primer, so as to ignite a propellant and fire a projectile through the barrel 110. Embodiments of the gun 100 may also include a blowback system, a locked breech system, or any combination thereof. These systems are more commonly found in self-reloading firearms. The blowback system may be responsible for obtaining energy from the motion of the case of the projectile as it is pushed to the rear of the gun 100 by expanding propellant, while the locked breech system may be responsible for slowing down the opening of the breech of a self-reloading firearm when fired. Accordingly, the gun 100 may support the semi-automatic firing of projectiles, the automatic firing of projectiles, or both.

The gun 100 may include one or more safeties that are meant to reduce the likelihood of an accidental discharge or an unauthorized use. The gun 100 may include one or more mechanical safeties, such as a trigger safety or a firing pin safety. The trigger safety may be incorporated in the trigger 105 to prevent the trigger 105 from moving in response to lateral forces placed on the trigger 105 or dropping the gun. The term "lateral forces," as used herein, may refer to a force that is substantially orthogonal to a central axis 145 that extends along the barrel 110 from the front to the rear of the gun 100. The firing pin safety may block the displacement path of the firing pin until the trigger 105 is pulled. Additionally or alternatively, the gun 100 may include one or more electronic safety components, such as an electronically actuated drop safety. In some cases, the gun 100 may include both mechanical and electronic safeties to reduce the potential for an accidental discharge and enhance the overall safety of the gun 100.

The gun 100 may include one or more sensors, such as a user presence sensor 125 and a biometric sensor 140. In some cases, the gun 100 may include multiple user presence sensors 125 whose outputs can collectively be used to detect the presence of a user. For example, the gun 100 may include a time of flight (TOF) sensor, a photoelectric sensor, a capacitive sensor, an inductive sensor, a force sensor, a resistive sensor, or a mechanical switch. As another example, the gun 100 may include a proximity sensor that is configured to emit an electromagnetic field or electromagnetic radiation, like infrared, and looks for changes in the field or return signal. As another example, the gun 100 may include an inertial measurement unit (IMU) configured to identify a presence event in response to measuring movement that matches a movement signature of a user picking up the gun 100. As another example, the gun 100 may include an audio input mechanism (e.g., a transducer implemented in a microphone) that is configured to generate a signal that is representative of nearby sounds, and the presence of the user can be detected based on an analysis of the signal.

The gun 100 may also include one or more biometric sensors 140 as shown in FIG. 1. For example, the gun 100 may include a fingerprint scanner (also referred to as a "fingerprint scanner"), an image sensor, or an audio input mechanism. The fingerprint scanner may generate a digital image (or simply "image") of the fingerprint pattern of the user, and the fingerprint pattern can be examined (e.g., on the gun 100 or elsewhere) to determine whether the user should be verified. The image sensor may generate an image of an anatomical feature (e.g., the face or eye) of the user, and the image can be examined (e.g., on the gun 100 or elsewhere) to determine whether the user should be verified. Normally, the image sensor is a charge-coupled device (CCD) or complementary metal-oxide semiconductor (CMOS) sensor that is included in a camera module (or simply "camera") able to generate color images. The image sensor need not necessarily generate images in color, however. In some embodiments, the image sensor is configured to generate ultraviolet, infrared, or near infrared images. Regardless of its nature, images generated by the image sensor can be used to authenticate the presence or identity of the user. As an example, an image generated by a camera may be used to perform facial recognition of the user. The audio input mechanism may generate a signal that is representative of audio containing the voice of the user, and the signal can be examined (e.g., on the gun 100 or elsewhere) to determine whether the user should be verified. Thus, the signal generated by the audio input mechanism may be used to perform speaker recognition of the user. Including multiple biometric sensors in the gun 100 may support a robust authentication procedure that functions in the event of sensor failure, thereby improving gun reliability. Note, however, that each of the multiple biometric sensors may not provide the same degree or confidence of identity verification. As an example, the output produced by one biometric sensor (e.g., an audio input mechanism) may be used to determine whether a user is present while the output produced by another biometric sensor (e.g., a fingerprint scanner or image sensor) may be used to verify the identity of the user in response to a determination that the user is present.

The gun 100 may include one or more components that facilitate the collection and processing of token data. For example, the gun 100 may include an integrated circuit (also referred to as a "chip") that facilitates wireless communication. The chip may be capable of receiving a digital identifier, such as a Bluetooth® token or a Near Field Communication (NFC) identifier. The term "authentication data" may be used to described data that is used to authenticate a user. For example, the gun 100 may collect authentication data from the user to determine that the user is authorized to operate the gun 100, and the gun 100 may be unlocked in based on determining that the user is authorized to operate the gun 100. Authentication data may include biometric data, token data, or both. Authentication data may be referred to as enrollment data when used to enroll a user, and authentication data may be referred to as query data when used to authenticate a user. In some examples, the gun may transform (e.g., encrypt, hash, transform, encode, etc.) enrollment data and store the transformed enrollment data in memory (e.g., non-volatile memory) of the gun, and the gun may discard or refrain from storing query data in the memory. Thus, the gun 100 may transform authentication data, so as to inhibit unauthenticated use even in the event of unauthorized access of the gun.

The gun 100 may support various types of aiming sights (or simply "sights"). At a high level, a sight is an aiming device that may be used to assist in visually aligning the gun 100 (and, more specifically, its barrel 110) with a target. For example, the gun 100 may include iron sights that improve aim without the use of optics. Additionally or alternatively, the gun 100 may include telescopic sights, reflex sights, or laser sights. In FIG. 1, the gun 100 includes two sights—namely, a front sight 130 and a rear sight 135. In some cases, the front sight 130 or the rear sight 135 may be used to indicate gun state information. For example, the front sight 130 may include a single illuminant that is able to emit light of different colors to indicate different gun states. As another example, the front sight 130 may include multiple illuminants, each of which is able to emit light of a different color, that collectively are able to indicate different gun states. One example of an illuminant is a light-emitting diode (LED).

The gun 100 may fire projectiles, and the projectiles may be associated with lethal force or less-lethal force. For example, the gun 100 may fire projectiles containing lead, brass, copper, zinc, steel, plastic, rubber, synthetic polymers (e.g., nylon), or a combination thereof. In some examples, the gun 100 is configured to fire lethal bullets containing lead, while in other cases the gun 100 is configured to fire less-lethal bullets containing rubber. As mentioned above, the technology described herein may also be used in the context of a gun that fires prongs (also referred to as "darts") which are intended to contact or puncture the skin of a target and then carry electric current into the body of the target. These guns are commonly referred to as "electronic control weapons" or "electroshock weapons." One example of an electroshock weapon is a TASER device.

The gun 100 may include a fire control system, and the fire control system may include an energy store (e.g., a capacitor bank) that is capable of storing electric charge and selectively discharging the electric charge. The electric charge may be transferred over a conductive path to an actuator, and an integrator may integrate a current induced voltage present across a resistor to determine how much electric charge has been discharged by the energy store into the actuator. Discharging electric charge into the actuator may cause the gun 100 to fire a projectile through the barrel 110. For example, discharging a threshold amount of electric charge into the actuator may cause displacement of the actuator that results in a projectile being propelled through the barrel 110. The fire control system may generate an integrated voltage using an integrator to integrate a current induced voltage that is present across a resistor, compare the integrated voltage against a reference voltage to determine whether the integrated voltage exceeds the reference voltage, and generate an output voltage that indicates whether the integrated voltage exceeds the reference voltage. The output voltage may be generated based on comparing the integrated voltage against the reference voltage using a comparator circuit, and the reference voltage may correspond to a threshold amount of electric charge.

Figure 2:
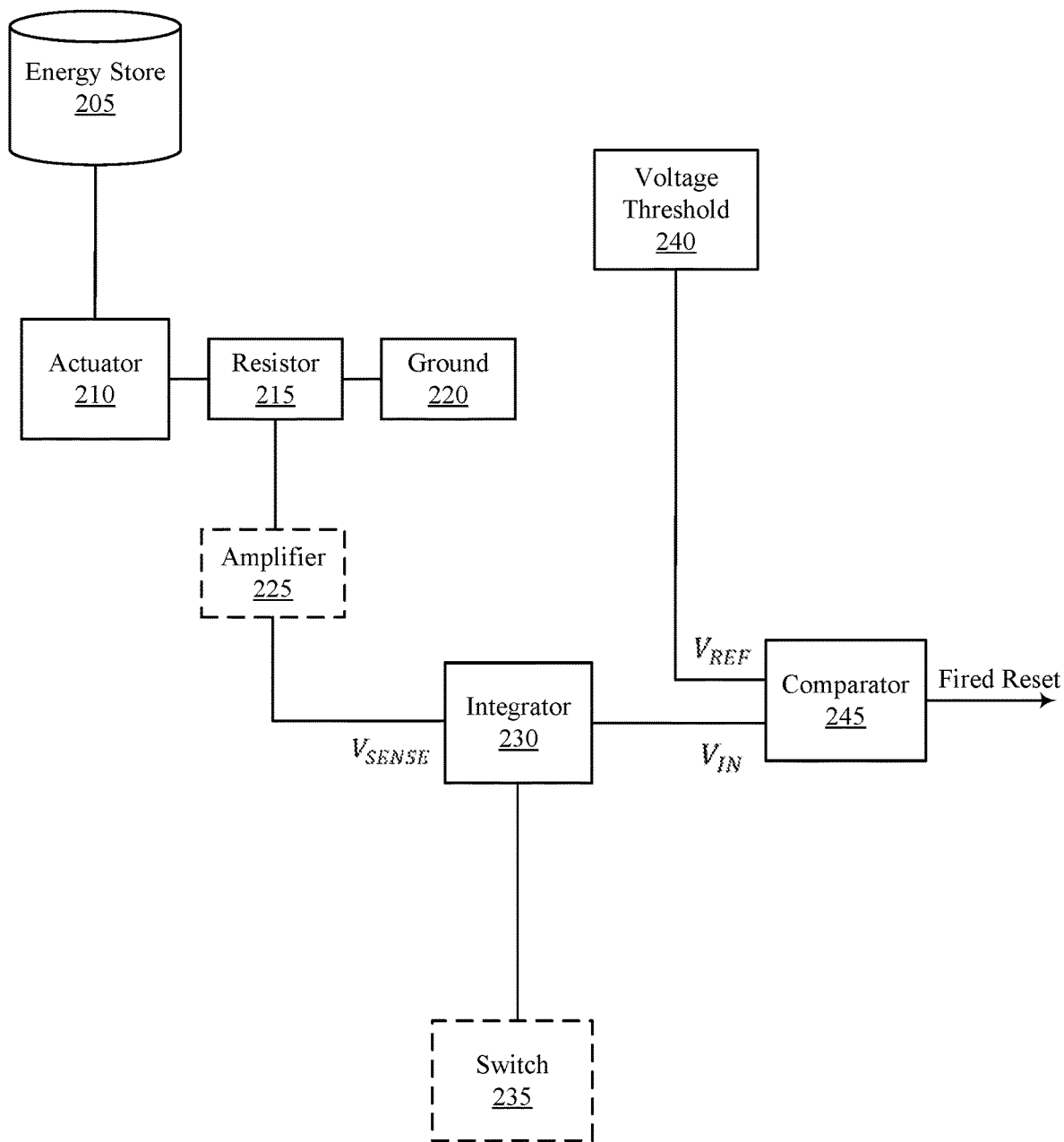
FIG. 2 illustrates an example of a block diagram showing a system for monitoring energy discharge.

FIG. 2 illustrates an example of a block diagram 200 that shows a system for monitoring energy discharge. Aspects of the block diagram 200 may be included in a weapon or gun described herein.

The block diagram 200 supports measuring energy discharge in an electromechanical gun. The block diagram 200 includes an example integrator 230 that calculates an integrated voltage ($V_{IN}$) over a time duration "t". The output of the integrator ($V_{IN}$) indicates the amount of electric charge discharged from the energy store 205 during the time duration "t". The electric charge may be directed at an actuator 210, which may include an electronic element, such as a solenoid, a piezoelectric element, or the like. The voltage threshold 240 may be used as a reference voltage ($V_{REF}$), and the comparator 245 compares $V_{IN}$ to $V_{REF}$ and indicates whether $V_{IN}$ exceeds $V_{REF}$. For example, when $V_{IN}$ is less than $V_{REF}$, the comparator 245 generates a first signal (e.g., a low voltage signal, a negative voltage, $-V_{CC}$, etc.), and when $V_{IN}$ is greater than $V_{REF}$, the comparator 245 generates a second signal (e.g., a high voltage signal, a positive voltage, $+V_{CC}$, etc.).

The reference voltage $V_{REF}$ may be determined or configured to represent the transfer of electric charge sufficient to displace an actuator. For example, $V_{REF}$ may be determined based on the specifications of the actuator 210, and $V_{REF}$ and/or $V_{IN}$ may be scaled to support multiple voltages, actuators, and weapon systems. As an illustrative example, $V_{REF}$ may be 0.25 volts, 5 volts, or anywhere in between, depending on the actuator, the solenoid, or the energy store. In some cases, $V_{REF}$ may be based on a programmable circuit (e.g., a mixed-signal integrated circuit, such as a GreenPAK™), while in some other cases, $V_{REF}$ may be based on a voltage divider, a diode drop voltage, a reference voltage, or the like. In some cases, $V_{IN}$ may be amplified across a low side resistor (where the sensing resistor is between load and ground), while in some other examples, $V_{IN}$ may be amplified across a high side resistor (where the sensing resistor is between power and load).

The block diagram 200 may include an amplifier 225 that amplifies voltage, such as a voltage present across a resistor 215 in the fire control system. Electric current may flow from the energy store 205, through an actuator, and across a resistor (e.g., a low side resistor) to generate a voltage that can be measured and used to determine the amount of discharged electric charge. In some cases, the amplifier 225 may not be present, while in some other cases the amplifier 225 may be present to perform voltage gain in stages (e.g., gain at the amplifier 225, gain at the integrator 230, and gain at the comparator 245), thereby improving the stability and reliability of the circuit and fire control system.

The switch 235 may reset the integrator 230 based on a trigger signal, the energy store 205 discharging a threshold amount of electric charge, the comparator 245 indicating that the integrated voltage ($V_{IN}$) exceeds the threshold voltage ($V_{REF}$), stacking capacitors of the energy store 205 such that a first group of capacitors is in series with a second group of capacitors, or any combination thereof. The block diagram 200 includes ground 220, but it should be understood that the block diagram may be modified to include additional or fewer ground terminals.

Figure 3:
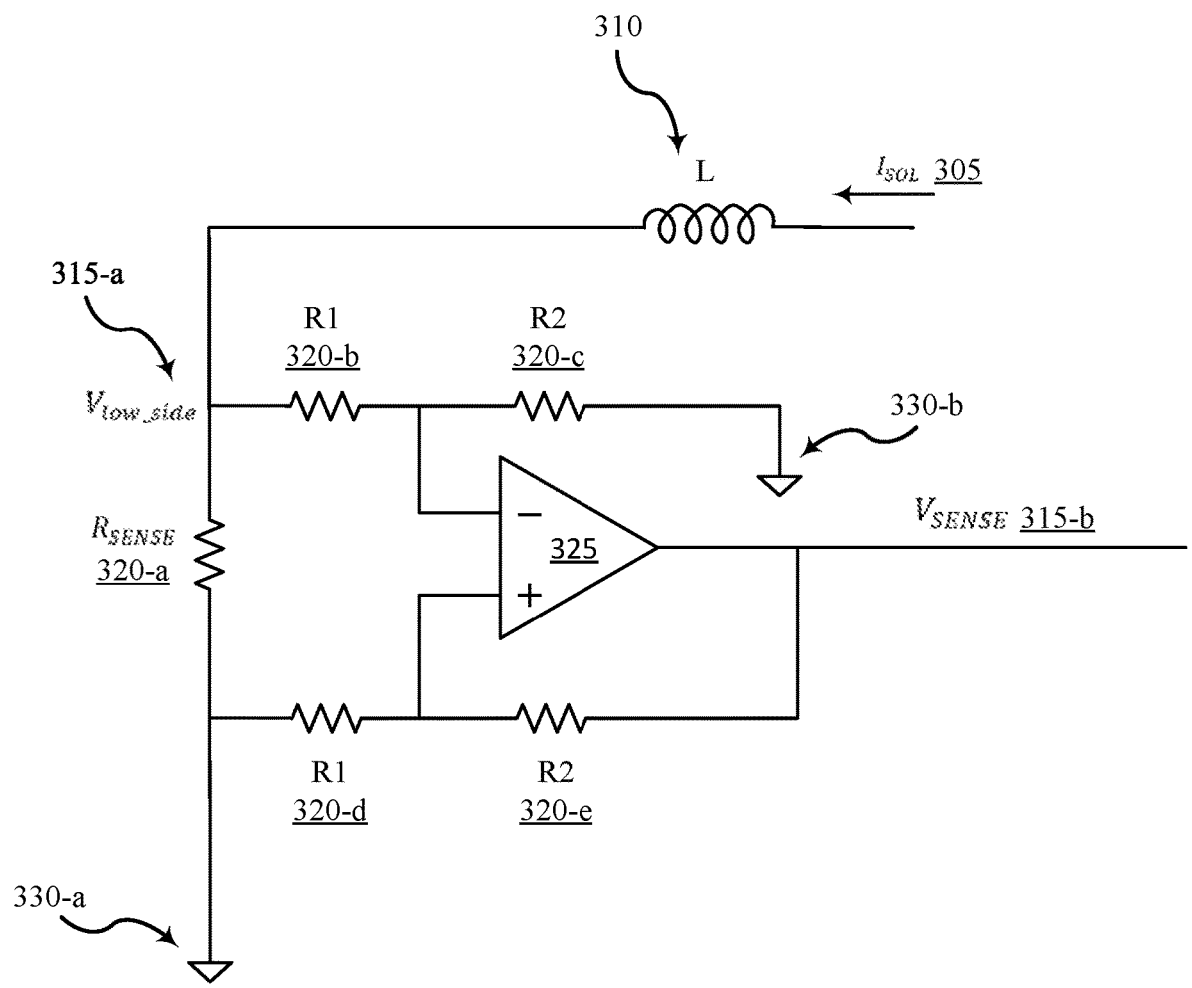
FIG. 3 illustrates an example of a schematic diagram showing a current sensor.

FIG. 3 illustrates an example of a schematic diagram 300 that shows a current sensor. A current sensor may also be referred to as a current sensing circuit. The schematic diagram 300 shows low-side current sensing as a non-limiting example of current sensing, but it should be understood that the systems described herein may use additional or alternative current sensing techniques, such high-side sensing, induction sensing, Hall effect sensing, or the like.

The schematic diagram 300 includes electric current 305, a solenoid 310, low side voltage 315-*a*, sensed voltage 315-*b*, a sensing resistor 320-*a*, resistor 320-*b*, resistor 320-*c*, resistor 320-*d*, resistor 320-*e*, amplifier 325, ground 330-*a*, and ground 330-*b*. The amplifier 325 may be coupled with an integrator, which may integrate the sensed voltage 315-*b* for a duration of time. The electric current 305 may flow through the solenoid 310 and across the sensing resistor 320-*a* (e.g., a shunt).

The solenoid 310 may be coupled or otherwise associated with an actuator, and the electric current 305 flowing through the solenoid 310 may result in displacement of an actuator plunger. The solenoid 310 may be associated with an inductance "L", which may be expressed by $$L = \frac{\mu N^2 A}{l},$$

where "µ" is the magnetic constant, "N" is the number of turns in the solenoid, "A" is the cross-sectional area of solenoid, and "l" is the length of the solenoid.

The electric current 305 induces the low side voltage 315-*a*, and the sensed voltage 315-*b* is an amplification of the low side voltage 315-*a*. The sensed voltage 315-*b* may be described by the low side voltage 315-*a* multiplied by the ohm value of R2 (resistor 320-*c* or resistor 320-*e*) divided by the ohm value of R1 (resistor 320-*b* or resistor 320-*d*). In other words, the output voltage ($V_{SENSE}$) may be expressed as the input voltage ($V_{low\_side}$) multiplied by the quotient of R2 and R1

$$\left(\text{e.g., } V_{SENSE} = V_{low\_side} * \left(\frac{R_2}{R_1}\right)\right).$$

The schematic diagram 300 includes ground 330-*a* and ground 330-*b*, but additional or fewer ground terminals may be present. The sensed voltage 315-*b* (the output voltage) may be integrated for a duration of time, and the integrated voltage may be used to indicate an amount of electric charge transmitted through the solenoid 310 during the duration of time. The integrated voltage and/or transmitted electric charge may be compared against a threshold associated with the solenoid to determine whether sufficient energy has been transferred for activating the actuator associated with the solenoid 310.

Figure 4:
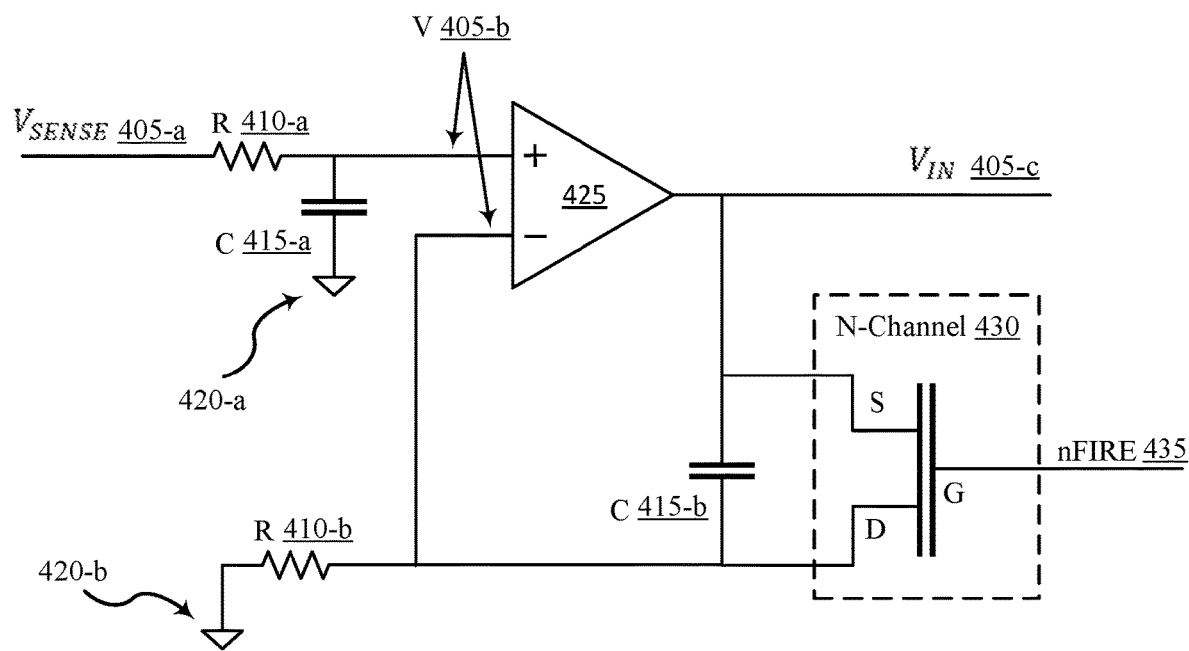
FIG. 4 illustrates an example of a schematic diagram showing an integrator.

FIG. 4 illustrates an example of a schematic diagram 400 that shows an integrator. An integrator may also be referred to as an integrator circuit. The schematic diagram 400 illustrates an example of an N-channel metal-oxide-semiconductor field-effect transistor (MOSFET), but it should be understood that the systems and techniques described herein may use additional or alternative types of transistors.

The schematic diagram 400 includes sensed voltage 405-*a*, voltage 405-*b*, integrated voltage 405-*c*, a resistor 410-*a*, a resistor 410-*b*, a capacitor 415-*a*, a capacitor 415-*b*, ground 420-*a*, ground 420-*b*, an integrator 425, an N-channel MOSFET 430, and an nFIRE signal 435. The N-channel MOSFET 430 (e.g., a switch, a field effect transistor (FET), etc.) includes a source (S), a drain (D), and a gate (G), and the nFIRE signal 435 may reset the N-channel MOSFET 430. The nFIRE signal 435 may be generated based on a trigger signal, a capacitor stack signal, a latch, or any combination thereof. Resetting the N-channel MOSFET 430 may reset the initial condition of the integrator 425, thereby improving system accuracy and reliability.

The integrated voltage 405-*c* is proportional to the instantaneous current and may be used to indicate the amount of electric charge discharged from the energy store. For example, the integrated voltage 405-*c* may be expressed by $$\frac{1}{R*C}\int_{t_0}^{t_f} V_{sense} dt.$$

Showing the derivation of the expression $$\frac{1}{R*C}\int_{t_0}^{t_f} V_{sense} dt,$$

the voltage is integrated $$\frac{(V_{sense} - V)}{R} = C\frac{dV}{dt},$$

now substituting, $$\frac{(V)}{R} = C\left(\frac{dV_{integrated}}{dt}\right),$$

now integrating $$V_{integrated} = \frac{1}{R*C}\int_{t_0}^{t_f} V_{sense} dt.$$

since the integrated voltage 405-*c* indicates the amount of transferred electric charge, a comparator may be used to compare the integrated voltage 405-*c* and a threshold voltage to determine whether a threshold amount of electric charge for activating the actuator is flowing through the actuator solenoid.

The fire control system may determine that a successful discharge condition is satisfied based on the integrated voltage 405-*c* exceeding the threshold voltage. The fire control system may determine that an unsuccessful discharge condition is satisfied based on the threshold voltage exceeding the integrated voltage 405-*c*, or based on the elapse of a time duration (e.g., $t_f - t_0$). In other words, the voltage may be integrated for a time duration "t," and if $V_{integrated}$ is greater than $V_{reference}$, than the successful discharge condition may be satisfied, but if the time duration "t" elapses (and $V_{integrated}$ is not greater than $V_{reference}$), than the unsuccessful discharge condition may be satisfied.

Figure 5:
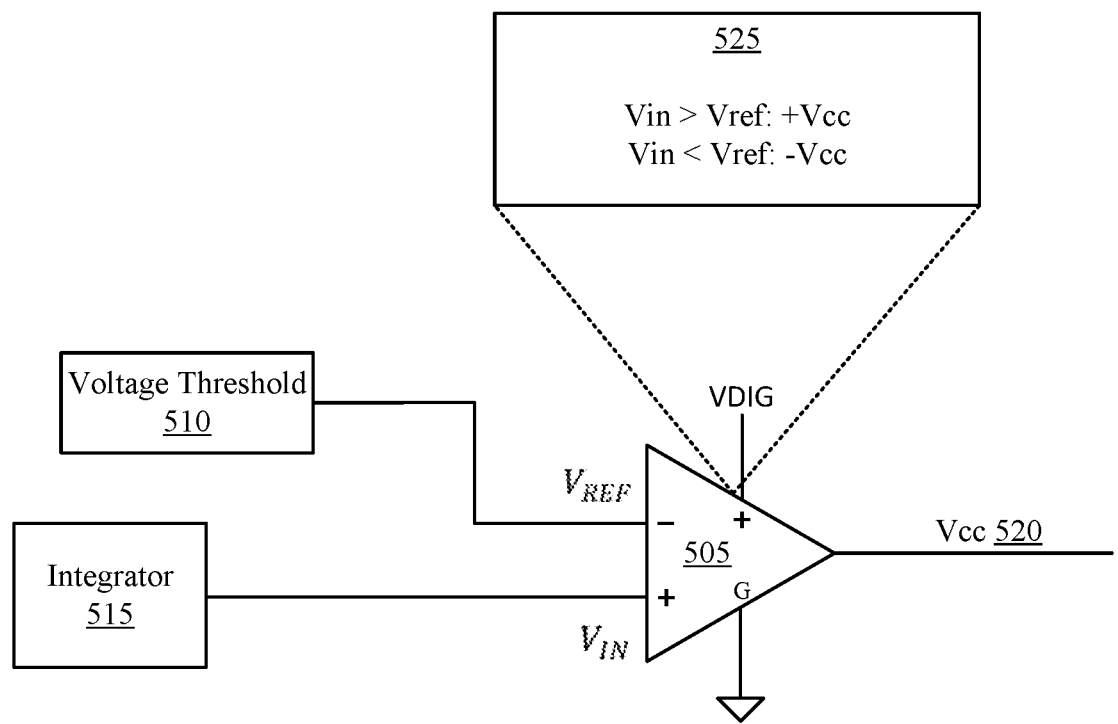
FIG. 5 illustrates examples of a schematic diagram showing a comparator.

FIG. 5 illustrates an example of a schematic diagram 500 that shows a comparator. A comparator may also be referred to as a comparator circuit. The schematic diagram 500 includes an example of a comparator that supports measuring energy discharge in a fire control system. The schematic diagram 500 illustrates an example of a comparator that indicates whether $V_{IN}$ (e.g., an integrated voltage, such as the integration of voltage that is present based on current flowing through an actuator solenoid and across a resistor) exceeds $V_{REF}$ (e.g., a threshold voltage corresponding to a threshold amount of electric charge sufficient for displacing the actuator).

The comparator 505 may generate the output signal 520 based on a first input signal (e.g., $V_{REF}$, which is based on the voltage threshold 510) and a second input signal (e.g., $V_{IN}$, which is based on by the integrator 515). The output signal 520 (e.g., +$V_{CC}$ or —$V_{CC}$) may be generated based on a comparison between the first input signal and the second input signal. For example, as shown in table 525, the comparator 505 may generate an output signal 520 that is positive (e.g., +$V_{CC}$, a positive voltage, etc.) when the integrated voltage ($V_{IN}$) is greater than the reference voltage ($V_{REF}$), and the comparator 505 may generate an output signal 520 that is negative (e.g., —$V_{CC}$, a negative voltage, etc.) when the reference voltage ($V_{REF}$) is greater than the integrated voltage ($V_{IN}$). As an illustrative example, the time duration "t" may correspond to 10 milliseconds (ms), 250 ms, or anywhere in between.

The schematic diagram 500 and/or the other illustrative figures herein may include one or more snubbers, which may reduce electromagnetic interference and improve system performance.

Figure 6:
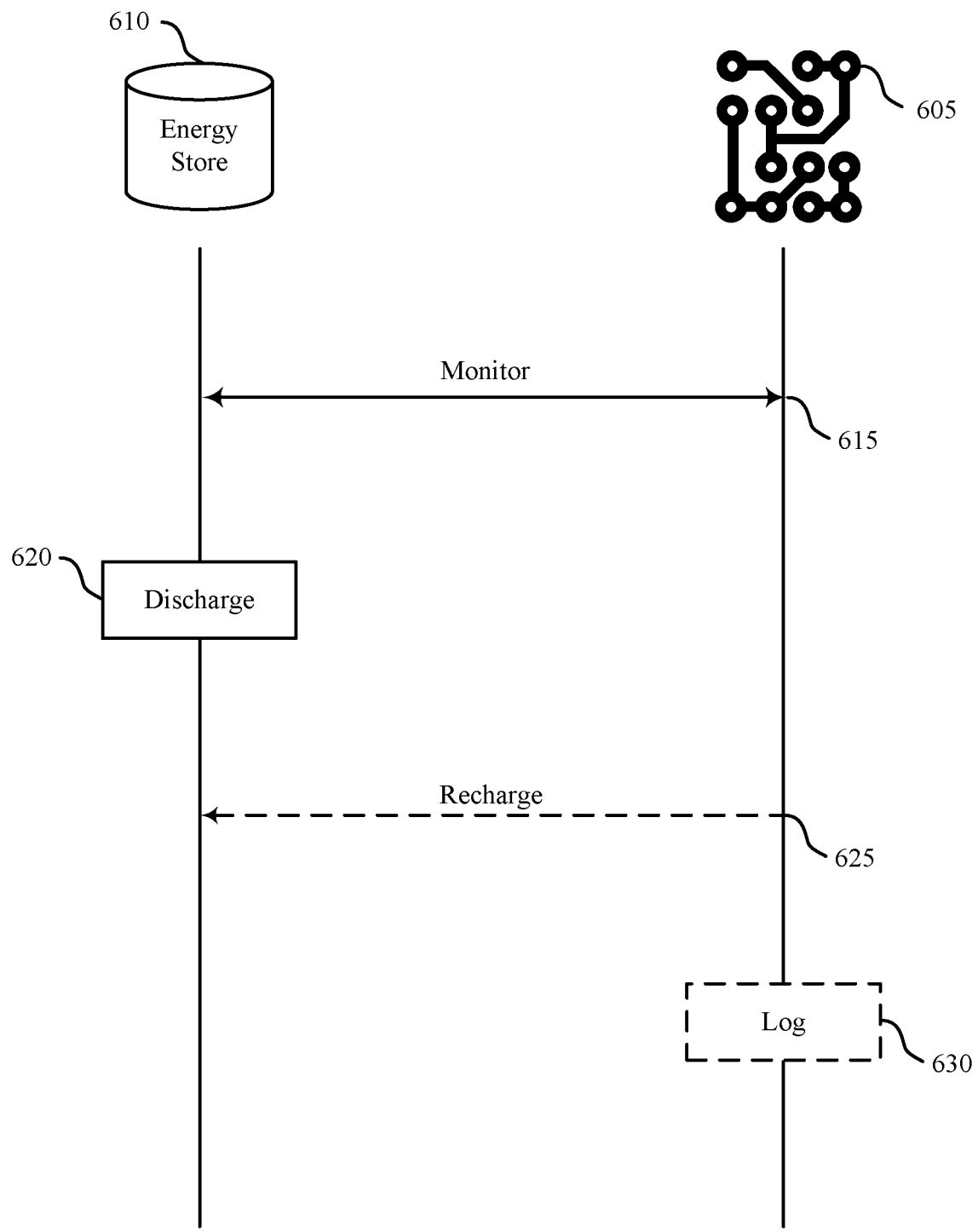
FIG. 6 illustrates an example of a process flow that supports monitoring the transfer of electric charge.

FIG. 6 illustrates an example of a process flow 600 that supports monitoring the transfer of electric charge. The process flow 600 includes a fire control manager 605 and an energy store 610. Alternative examples of the following may be implemented, where some steps are performed in a different order than described or are not performed at all. In some cases, steps may include additional features not mentioned below, or further steps may be added.

At step 615, the fire control manager 605 may monitor the energy store 610 to determine how much electric charge is being discharged by the energy store 610. In some examples, the energy store 610 may be a capacitor bank, and the capacitor bank may include one or more capacitors.

At step 620, the energy store 610 may discharge electric charge. As a result of discharging the electric charge, electric current may travel across a resistor, and the fire control manager 605 may integrate the current induced voltage present across the resistor. The fire control manager 605 may compare the integrated voltage against a reference voltage to determine whether a threshold amount of electric charge has been discharged by the energy store 610.

At step 625, the fire control manager 605 may recharge the energy store 610 with electric charge. For example, the fire control manager 605 may cause electric charge to be transferred from a battery to the energy store 610. In some examples, the fire control manager 605 may recharge the energy store 610 based on the integrated voltage exceeding the reference voltage. In other words, the fire control manager 605 may recharge the energy store 610 based on the energy store 610 discharging at least a threshold amount of electric charge.

Figure 7:
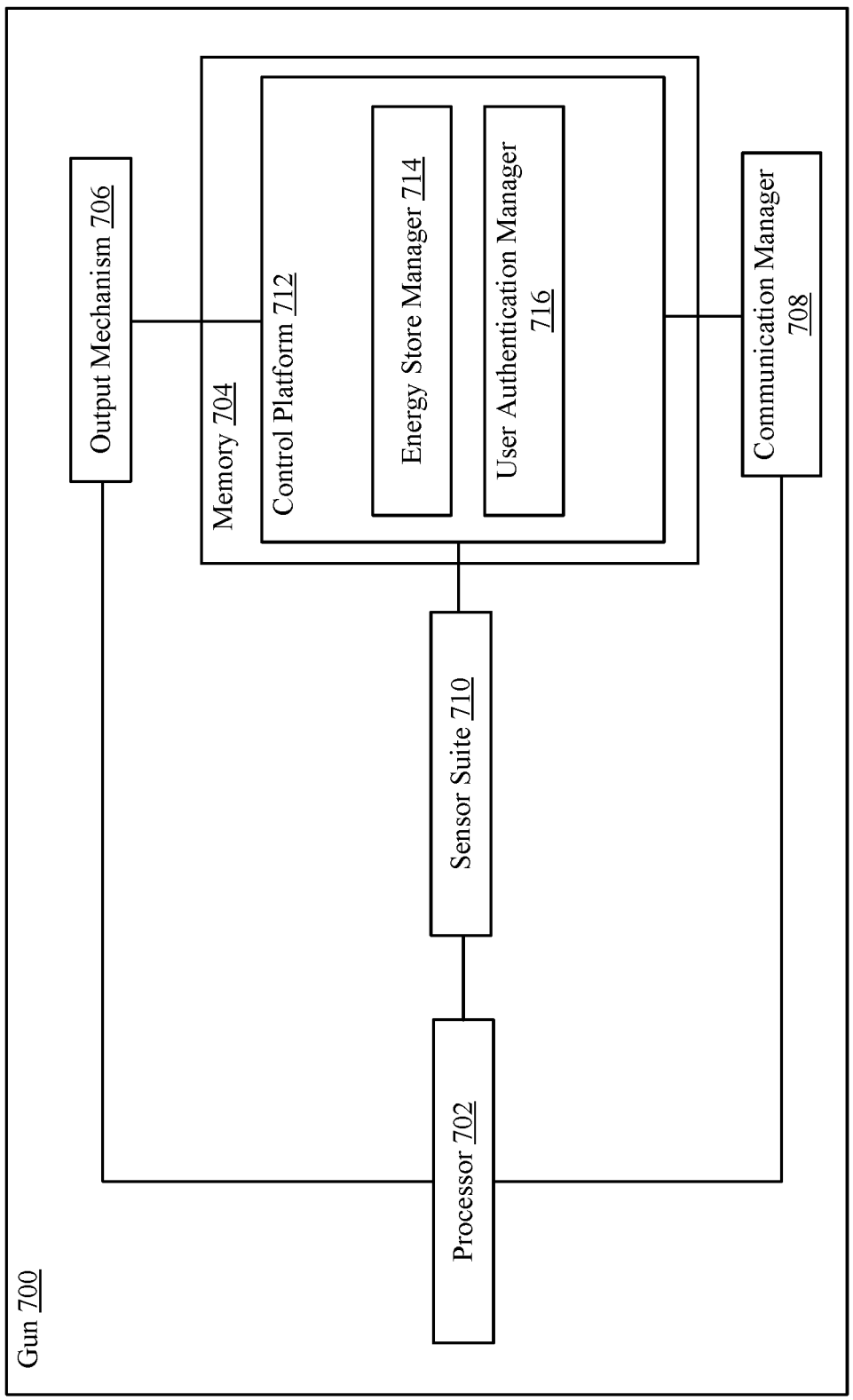
FIG. 7 illustrates an example of a gun that supports monitoring the transfer of electric charge.

At step 630, the fire control manager 605 may log an indication of a successful fire or an indication of an unsuccessful fire. As an example, the fire control manager 605 may log an indication of a successful fire based on the integrated voltage exceeding the reference voltage. As another example, the fire control manager 605 may log an indication of an unsuccessful fire based on the reference voltage exceeding the integrated voltage FIG. 7 illustrates an example of a gun 700 able to implement a control platform 712 designed to produce outputs that are helpful in ensuring the gun 700 is used in an appropriate manner. As further discussed below, the control platform 712 (also referred to as a "management platform" or a "fire control manager") may be designed to monitor and manage a fire control system of a gun. For example, the control platform 712 may monitor the discharge of electric charge and determine whether a threshold amount of electric charge has been discharged. In some examples, the threshold amount of electric charge may correspond to an amount of electric charge that is sufficient to cause the gun 700 to fire a projectile.

In some embodiments, the control platform 712 is embodied as a computer program that is executed by the gun 700. In other embodiments, the control platform 712 is embodied as an electrical circuit that performs logical operations of the gun 700. In yet other embodiments, the control platform 712 is embodied as a computer program that is executed by a computing device to which the gun 700 is communicatively connected. In such embodiments, the gun 700 may transmit relevant information to the computing device for processing as further discussed below. Those skilled in the art will recognize that aspects of the computer program could also be distributed amongst the gun 700 and computing device.

The gun 700 can include a processor 702, memory 704, output mechanism 706, and communication manager 708. The processor 702 can have generic characteristics similar to general-purpose processors, or the processor 702 may be an application-specific integrated circuit (ASIC) that provides control functions to the gun 700. As shown in FIG. 7, the processor 702 can be coupled with all components of the gun 700, either directly or indirectly, for communication purposes.

The memory 704 may be comprised of any suitable type of storage medium, such as static random-access memory (SRAM), dynamic random-access memory (DRAM), electrically erasable programmable read-only memory (EEPROM), flash memory, or registers. In addition to storing instructions that can be executed by the processor 702, the memory 704 can also store data generated by the processor 702 (e.g., when executing the managers of the control platform 712). Note that the memory 704 is merely an abstract representation of a storage environment. The memory 704 could be comprised of actual memory chips or managers.

The output mechanism 706 can be any component that is capable of conveying information to a user of the gun 700. For example, the output mechanism 706 may be a display panel (or simply "display") that includes LEDs, organic LEDs, liquid crystal elements, or electrophoretic elements. Alternatively, the display may simply be a series of illuminants (e.g., LEDs) that are able to indicate the status of the gun 700. Thus, the display may indicate whether the gun 700 is presently in a locked state, unlocked state, etc. As another example, the output mechanism 706 may be a loudspeaker (or simply "speaker") that is able to audibly convey information to the user.

The communication manager 708 may be responsible for managing communications between the components of the gun 700. Additionally or alternatively, the communication manager 708 may be responsible for managing communications with computing devices that are external to the gun 700. Examples of computing devices include mobile phones, tablet computers, wearable electronic devices (e.g., fitness trackers), and network-accessible server systems comprised of computer servers. Accordingly, the communication manager 708 may be wireless communication circuitry that is able to establish communication channels with computing devices. Examples of wireless communication circuitry include integrated circuits (also referred to as "chips") configured for Bluetooth, NFC, and the like.

Sensors are normally implemented in the gun 700. Collectively, these sensors may be referred to as the "sensor suite" 710 of the gun 700. For example, the gun 700 may include a motion sensor whose output is indicative of motion of the gun 700 as a whole. Examples of motion sensors include multi-axis accelerometers and gyroscopes. As another example, the gun 700 may include a proximity sensor whose output is indicative of proximity of the gun 700 to a nearest obstruction within the field of view of the proximity sensor. A proximity sensor may include, for example, an emitter that is able to emit infrared (IR) light and a detector that is able to detect reflected IR light that is returned toward the proximity sensor. These types of proximity sensors are sometimes called laser imaging, detection, and ranging (LiDAR) scanners. As another example, the gun 700 may include a fingerprint sensor or camera that generates images which can be used for, for example, biometric authentication. As shown in FIG. 7, outputs produced by the sensor suite 710 may be provided to the control platform 712 for examination or analysis.

For convenience, the control platform 712 may be referred to as a computer program that resides in the memory 704. However, the control platform 712 could be comprised of software, firmware, or hardware components that are implemented in, or accessible to, the gun 700. In accordance with embodiments described herein, the control platform 712 may include an energy store manager 714 and a user authentication manager 716. As an illustrative example, the energy store manager 714 may control the charging of an energy store and/or the monitoring of the energy store, and the user authentication manager 716 may perform a user authentication produce to determine whether the person holding the gun 700 is authorized to operate the gun 700. Because the data obtained by these managers may have different formats, structures, and content, the instructions executed by these managers can (and often will) be different. For example, the instructions executed by the energy store manager 714 to control the charging of the energy store may be different than the instructions generated by the user authentication manger 716 to determine whether the user holding the gun 700 is authorized to operate the gun 700. As a specific example, the user authentication manager 716 may implement image processing algorithms (e.g., for denoising, despeckling, binarization, etc.) that are not necessary for charging an energy store with electric charge.

Figure 8:
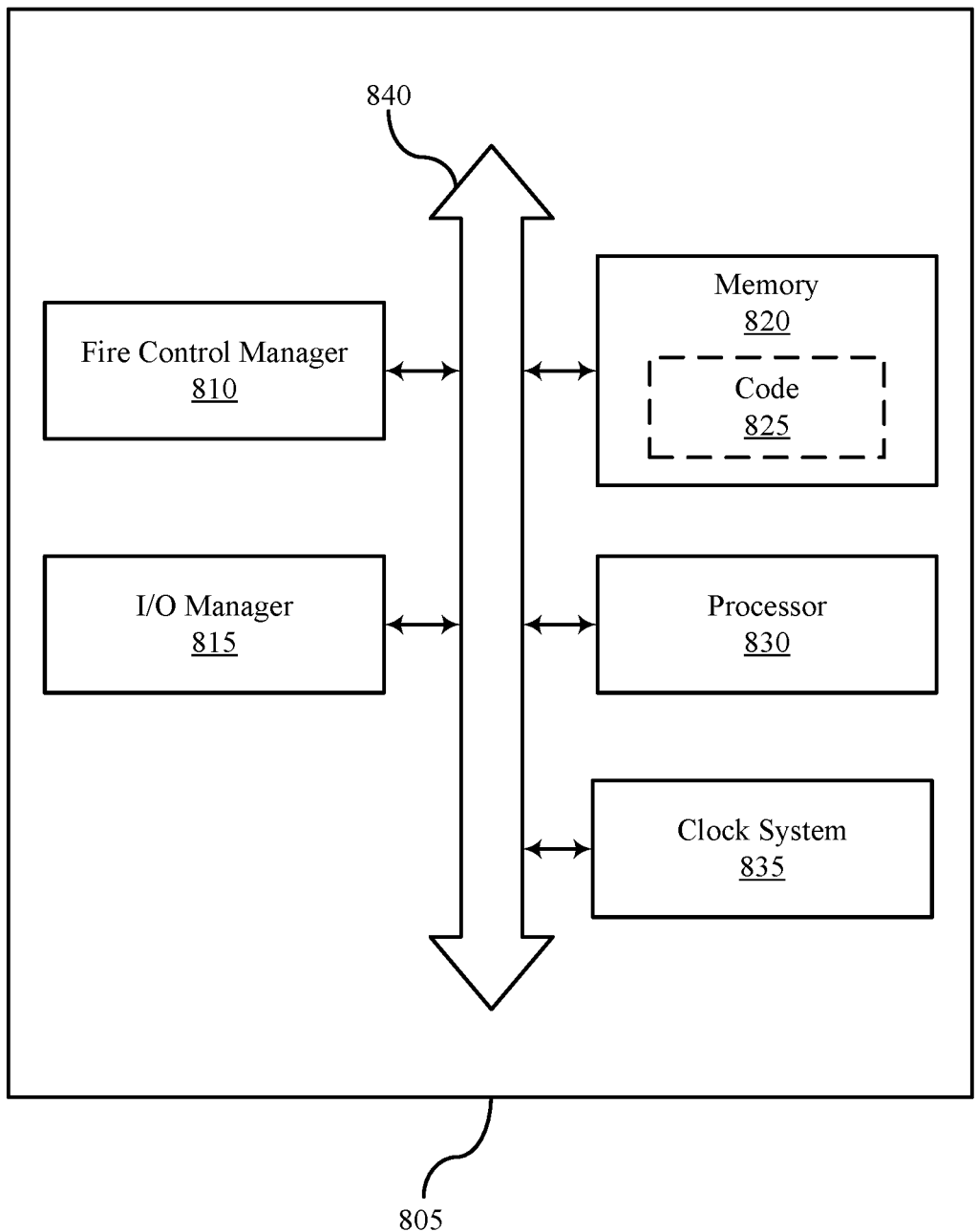
FIG. 8 illustrates an example of a system that supports monitoring the transfer of electric charge.

FIG. 8 illustrates an example of a system 800 that supports monitoring the transfer of electric charge. The device 805 may be operable to implement the techniques, technology, or systems disclosed herein. The device 805 may include components such as a fire control manager 810, an input/output (I/O) manager 815, memory 820, code 825, a processor 830, a clock system 835, and a bus 840. The components of the device 805 may communicate via one or more buses 840. The device 805 may be an example of, or include components of, an electrical circuit, a fire control system, or a gun.

The fire control manager 810 may generate an integrated voltage using an integrator circuit to integrate a current induced voltage that is present across a resistor, compare the integrated voltage against a reference voltage to determine whether the integrated voltage exceeds the reference voltage, and generate an output voltage that indicates whether the integrated voltage exceeds the reference voltage. The output voltage may indicate whether the integrated voltage exceeds the reference voltage, and the reference voltage may correspond to a threshold amount of electric charge. The fire control manager 810 may recharge an energy store based on the output voltage indicating that the integrated voltage exceeds the reference voltage. In some examples, the fire control manager 810 may recharge the energy store based on the output voltage indicating that the integrated voltage exceeds the reference voltage prior to expiration of a timer.

The I/O manager 815 may manage input and output signals for the device 805. The I/O manager 815 may also manage various peripherals such an input device (e.g., a button, a switch, a touch screen, a dock, a biometric sensor, a pressure sensor, a heat sensor, a proximity sensor, an RFID sensor, etc.) and an output device (e.g., a monitor, a display, an LED, a speaker, a haptic motor, a heat pipe, etc.).

The memory 820 may include or store code (e.g., software) 825. The memory 820 may include volatile memory, such as random-access memory (RAM) and/or non-volatile memory, such as read-only memory (ROM). The code 825 may be computer-readable and computer-executable, and when executed, the code 825 may cause the processor 830 to perform various operations or functions described here.

The processor 830 may be an example or component of a central processing unit (CPU), an application specific integrated circuit (ASIC), or a field programmable gate array (FPGA). In some embodiments, the processor 830 may utilize an operating system or software such as Microsoft Windows®, iOS®, Android®, Linux®, Unix®, or the like. The clock system 835 control a timer for use by the disclosed embodiments.

The fire control manager 810, or its sub-components, may be implemented in hardware, software (e.g., software or firmware) executed by a processor, or a combination thereof. The fire control manager 810, or its sub-components, may be physically located in various positions. For example, in some cases, the fire control manager 810, or its sub-components may be distributed such that portions of functions are implemented at different physical locations by one or more physical components.

Figure 9:
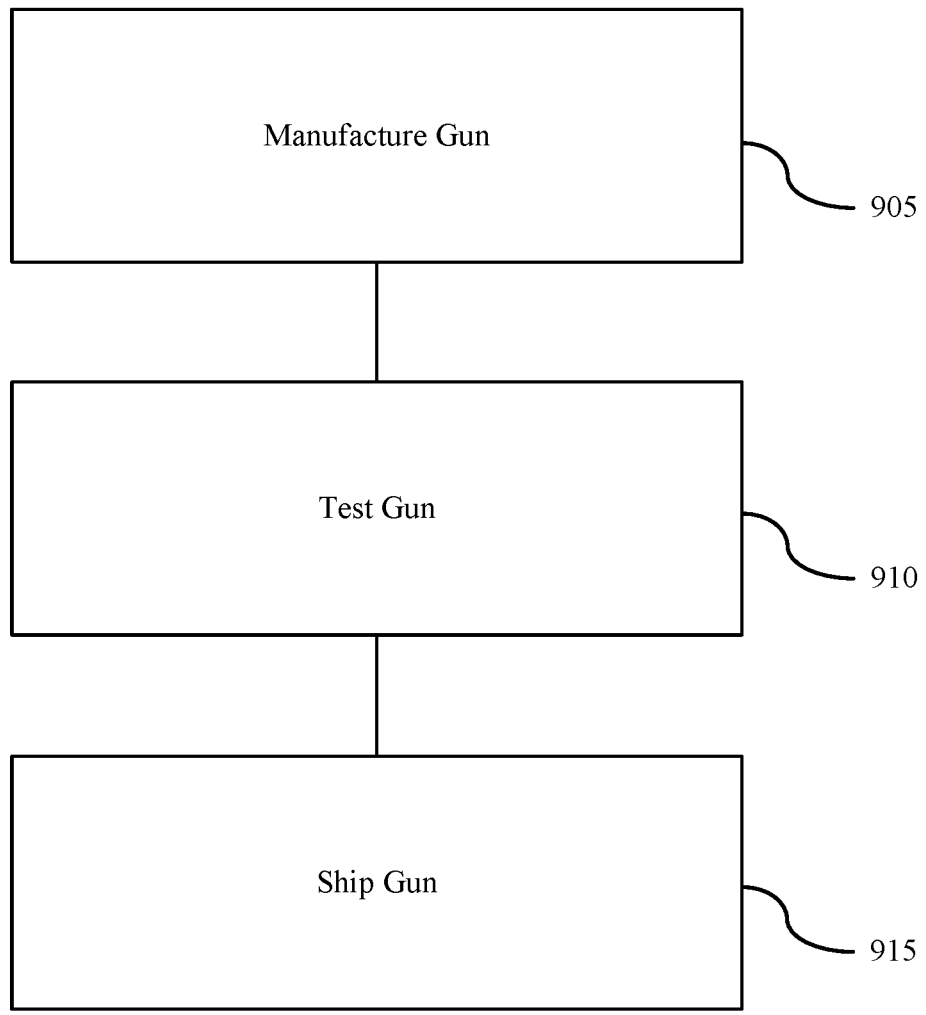
FIG. 9 illustrates an example of a flowchart showing a method of manufacturing a gun that is capable of monitoring the transfer of electric charge.

FIG. 9 illustrates an example of a flowchart 900 showing a method of manufacturing a gun that is capable of monitoring the transfer of electric charge. Note that while the sequences of the steps performed in the processes described herein are exemplary, the steps can be performed in various sequences and combinations. For example, steps could be added to, or removed from, these processes. Similarly, steps could be replaced or reordered. Thus, the descriptions of these processes are intended to be open ended.

Initially, a gun manufacturer (or simply "manufacturer") may manufacture a gun that is able to implement aspects of the present disclosure (step 905). For example, the manufacturer may machine, cut, shape, or otherwise make parts to be included in the gun. Thus, the manufacturer may also design those parts before machining occurs, or the manufacturer may verify designs produced by another entity before machining occurs. Additionally or alternatively, the manufacturer may obtain parts that are manufactured by one or more other entities. Thus, the manufacturer may manufacture the gun from components produced entirely by the manufacturer, components produced by other entities, or a combination thereof. Often, the manufacturer will obtain some parts and make other parts that are assembled together to form the gun (or a component of the gun).

The gun may include an electronic fire control system, and the fire control system may include an energy store, an integrator, a mixed signal circuit, and a comparator. The integrator may integrate a current induced voltage to produce an integrated voltage, the mixed signal circuit may generate a reference voltage, and the comparator may compare the integrated voltage against the reference voltage. The comparator may generate an output indicating whether the integrated voltage exceeds the reference voltage. In some examples, the electronic fire control system may be manufactured as part of the gun, while in some other examples, the electronic fire control system may be manufactured separately from the gun. For example, the electronic fire control system may be manufactured separately from the gun and inserted into the gun during assembly.

In some embodiments, the manufacturer also generates identifying information related to the gun. For example, the manufacturer may etch (e.g., mechanically or chemically), engrave, or otherwise append identifying information onto the gun itself. As another example, the manufacturer may encode at least some identifying information into a data structure that is associated with the gun. For instance, the manufacturer may etch a serial number onto the gun, and the manufacturer may also populate the serial number (and other identifying information) into a data structure for recording or tracking purposes. Examples of identifying information include the make of the gun, the model of the gun, the serial number, the type of projectiles used by the gun, the caliber of those projectiles, the type of firearm, the barrel length, and the like. In some cases, the manufacturer may record a limited amount of identifying information (e.g., only the make, model, and serial number), while in other cases the manufacturer may record a larger amount of identifying information.

The manufacturer may then test the gun (step 910). In some embodiments, the manufacturer tests all of the guns that are manufactured. In other embodiments, the manufacturer tests a subset of the guns that are manufactured. For example, the manufacturer may randomly or semi-randomly select guns for testing, or the manufacturer may select guns for testing in accordance with a predefined pattern (e.g., one test per 5 guns, 10 guns, or 100 guns). Moreover, the manufacturer may test the gun in its entirety, or the manufacturer may test a subset of its components. For example, the manufacturer may test the component(s) that it manufactures. As another example, the manufacturer may test newly designed components or randomly selected components. Thus, the manufacturer could test select component(s) of the gun, or the manufacturer could test the gun as a whole. For example, the manufacturer may test the barrel to verify that it meets a precision threshold and the cartridge feed system to verify that it meets a reliability threshold. As another example, the manufacturer may test a group of guns (e.g., all guns manufactured during an interval of time, guns selected at random over an interval of time, etc.) to ensure that those guns fire at a sufficiently high pressure (e.g., 70,000 pounds per square inch (PSI)) to verify that a safety threshold is met.

Thereafter, the manufacturer may ship the gun to a dealer (step 915). In the event that the gun is a firearm, the manufacturer may ship the gun to a Federal Firearms Licensed (FFL) dealer. For example, a purchaser (also referred to as a "customer") may purchase the apparatus through a digital channel or non-digital channel. Examples of digital channels include web browsers, mobile applications, and desktop applications, while examples of non-digital channels include ordering via the telephone and ordering via a physical storefront. In such a scenario, the gun may be shipped to the FFL dealer so that the purchaser can obtain the gun from the FFL dealer. The FFL dealer may be directly or indirectly associated with the manufacturer of the gun. For example, the FFL dealer may be a representative of the manufacturer, or the FFL dealer may sell and distribute guns on behalf of the manufacturer (and possibly other manufacturers).

Note that while the sequences of the steps performed in the processes described herein are exemplary, the steps can be performed in various sequences and combinations. For example, steps could be added to, or removed from, these processes. Similarly, steps could be replaced or reordered. As an example, the manufacturer may iteratively test components while manufacturing the gun, and therefore perform multiple iterations of steps 905 and 910 either sequentially or simultaneously (e.g., one component may be tested while another component is added to the gun). Thus, the descriptions of these processes are intended to be open ended.

Figure 10:
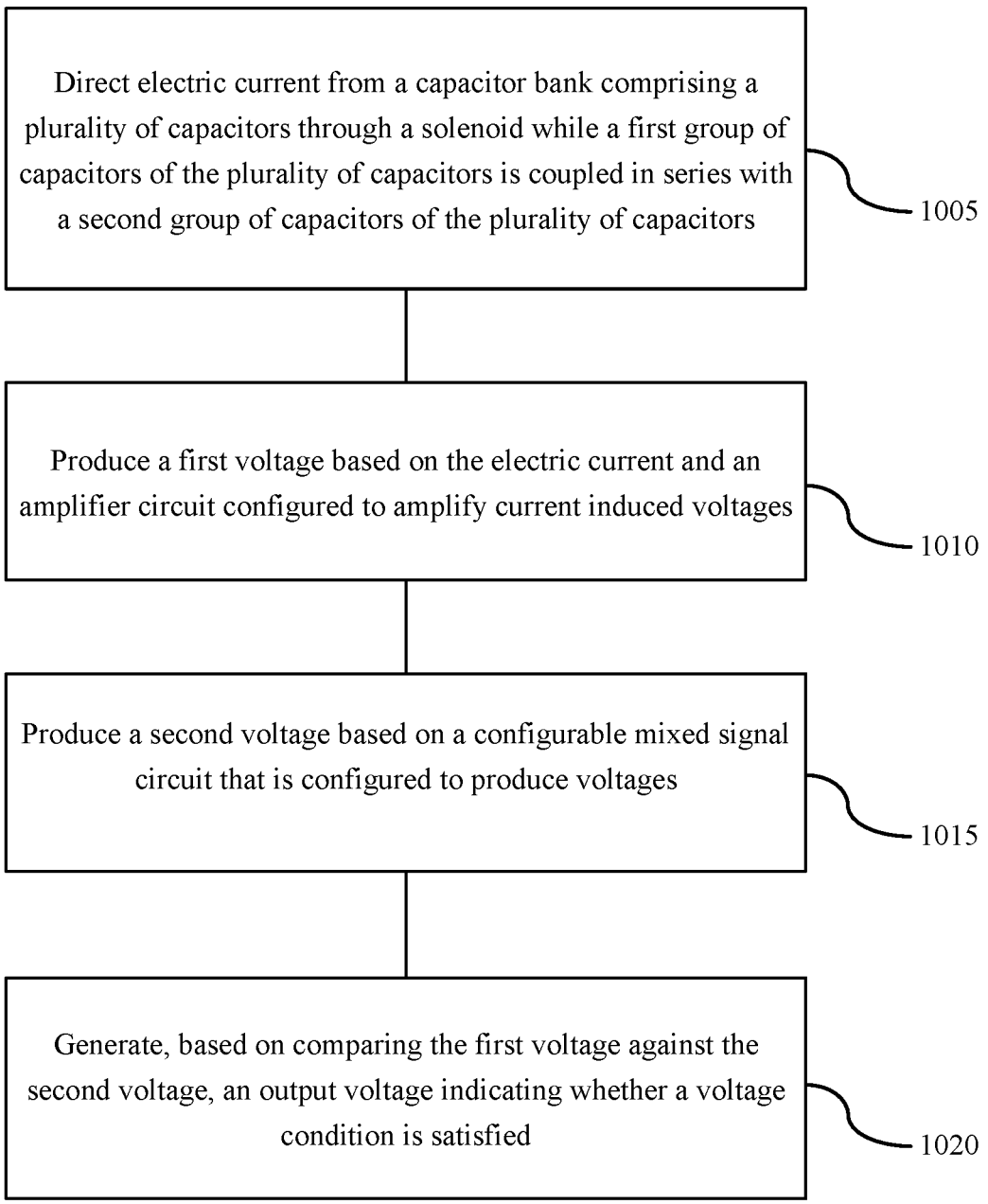
FIG. 10 illustrates an example of a flowchart showing a method of monitoring the transfer of electric charge.

FIG. 10 shows a flowchart illustrating a method 1000 that supports monitoring the transfer of electric charge in accordance with aspects of the present disclosure. The operations of the method 1000 may be implemented by a gun or its components as described herein. For example, the operations of the method 1000 may be performed by an electrical circuit or a fire control system. In some examples, a gun may execute a set of instructions to control the functional elements of the to perform the described functions. Additionally or alternatively, the gun may perform aspects of the described functions using special-purpose hardware.

At step 1005, a fire control system may direct electric current from a capacitor bank comprising a plurality of capacitors through a solenoid while a first group of capacitors of the plurality of capacitors is coupled in series with a second group of capacitors of the plurality of capacitors.

At step 1010, the fire control system may produce a first voltage based on the electric current and an amplifier circuit configured to amplify current induced voltages. In some examples, the first voltage may be produced by a current sensor.

At step 1015, the fire control system may produce a second voltage based on a configurable mixed signal circuit that is configured to produce voltages. In some examples, the mixed signal circuit may include a programmable circuit, a voltage divider, a diode, or the like.

At step 1020, the fire control system may generate, based on comparing the first voltage against the second voltage, an output voltage indicating whether a voltage condition is satisfied. In some examples, the voltage condition is satisfied when a threshold amount of electric charge is transferred though the solenoid so as to cause displacement of an actuator that is located proximate to the solenoid.

Note that while the sequences of the steps performed in the processes described herein are exemplary, the steps can be performed in various sequences and combinations. For example, steps could be added to, or removed from, these processes. Similarly, steps could be replaced or reordered. Thus, the descriptions of these processes are intended to be open ended.

Figure 11:
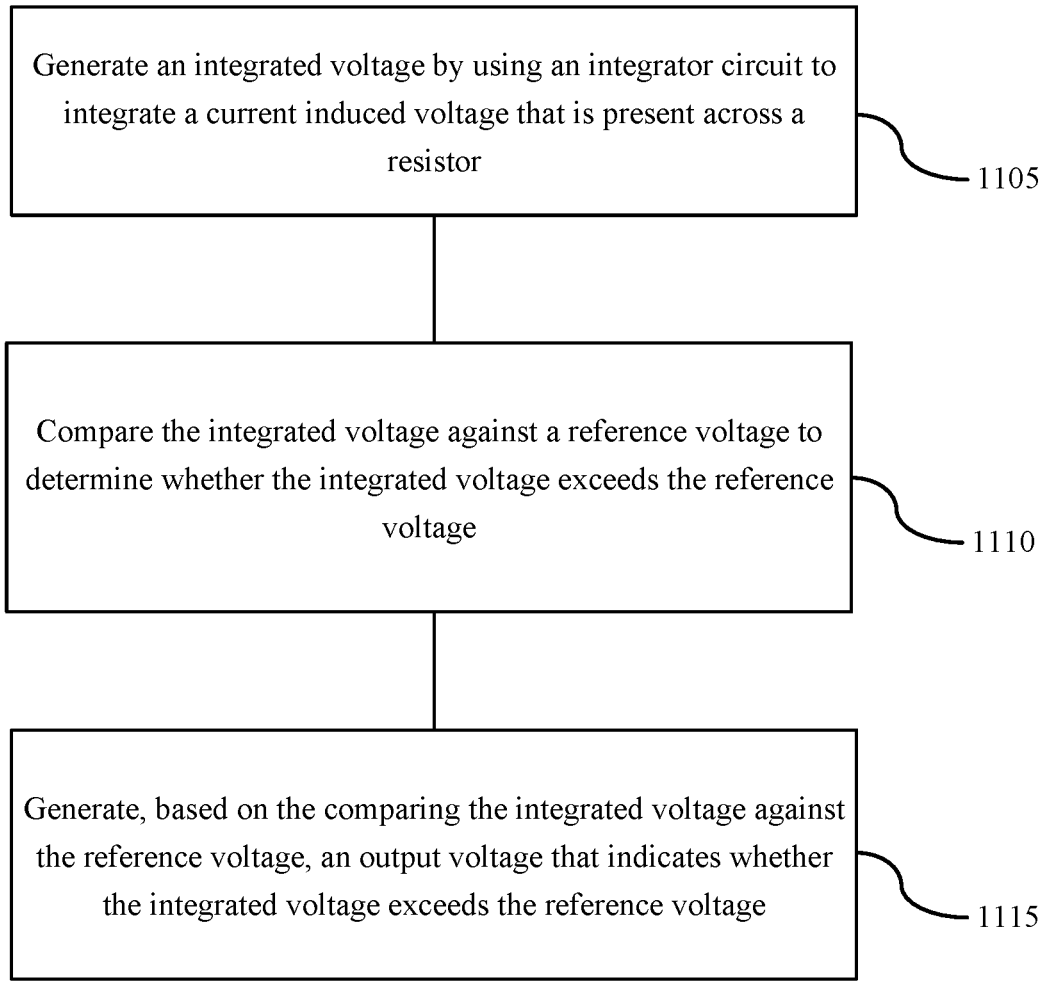
FIG. 11 illustrates an example of a flowchart showing a method of monitoring the transfer of electric charge.

FIG. 11 shows a flowchart illustrating a method 1100 that supports monitoring the transfer of electric charge in accordance with aspects of the present disclosure. The operations of the method 1100 may be implemented by a gun or its components as described herein. For example, the operations of the method 1100 may be performed by an electrical circuit or a fire control system. In some examples, a gun may execute a set of instructions to control the functional elements of the to perform the described functions. Additionally or alternatively, the gun may perform aspects of the described functions using special-purpose hardware.

At step 1105, a fire control system may generate an integrated voltage using an integrator to integrate a current induced voltage that is present across a resistor. The fire control system may include an integrator (e.g., an op-amp integrator, an integrator circuit, etc.), and the integrator may be used to generate the integrated voltage.

At step 1110, the fire control system may compare the integrated voltage against a reference voltage to determine whether the integrated voltage exceeds the reference voltage. In some examples, the reference voltage corresponds to a threshold amount of electric charge. The fire control system may include a comparator (e.g., an op-amp comparator, a comparator circuit, etc.), and the comparator may compare the integrated voltage against a reference voltage. The reference voltage may be generated by a mixed signal circuit, such as a programmable circuit, a voltage divider, a diode, or the like.

At step 1115, the fire control system may generate, based on the comparing the integrated voltage against the reference voltage, an output voltage that indicates whether the integrated voltage exceeds the reference voltage. The comparator may generate the output voltage, and the output voltage may indicate that the integrated voltage exceeds the reference voltage, or the output voltage may indicate the reference voltage exceeds the integrated voltage.

Note that while the sequences of the steps performed in the processes described herein are exemplary, the steps can be performed in various sequences and combinations. For example, steps could be added to, or removed from, these processes. Similarly, steps could be replaced or reordered. Thus, the descriptions of these processes are intended to be open ended.

Examples

Several aspects of the present disclosure are set forth examples. Note that, unless otherwise specified, all of these examples can be combined with one another. Accordingly, while a feature may be described in the context of a given example, the feature may be similarly applicable to other examples.

In some examples, the techniques described herein relate to an electrical circuit for monitoring discharge of electric charge within a gun, the electrical circuit including: a capacitor bank including a plurality of capacitors, the capacitor bank supporting a first capacitor configuration and a second capacitor configuration, wherein the first capacitor configuration includes the plurality of capacitors coupled in parallel, and wherein the second capacitor configuration includes a first group of capacitors of the plurality of capacitors coupled in series with a second group of capacitors of the plurality of capacitors; a solenoid coupled with the capacitor bank, wherein the solenoid is coupled with an actuator such that the actuator is displaced in response to a current induced electromagnetic field produced by the solenoid; a voltage sensing circuit coupled with the solenoid, the voltage sensing circuit including a low-side resistor located between the solenoid and a ground terminal; an integrator circuit coupled with the voltage sensing circuit, wherein the integrator circuit is configured to generate an integrated voltage indicating an amount of electric charge discharged by the capacitor bank while the capacitor bank is in the second capacitor configuration; a configurable circuit that is configured to generate a reference voltage; and a comparator circuit, including: a first input terminal coupled with the configurable circuit, a second input terminal coupled with the integrator circuit, and an output terminal configured to generate an output signal based on comparing a first signal associated with the first input terminal and a second signal associated with the second input terminal, wherein the output signal indicates whether the amount of transmitted electric charge satisfies an electric charge threshold associated with the actuator.

In some examples, the techniques described herein relate to an electrical circuit for monitoring discharge of electric charge within a gun, the electrical circuit including: an energy store including at least one capacitor, wherein the energy store is configured to selectively discharge electric charge; an integrator circuit that is electronically coupled with the energy store, wherein the integrator circuit is configured to integrate a sensed voltage and produce an integrated voltage as output, wherein the integrated voltage indicates an amount of transferred electric charge; and a comparator circuit configured to receive (i) the integrated voltage and (ii) a reference voltage as inputs and produce an output voltage indicating whether the integrated voltage exceeds the reference voltage.

In some examples, the techniques described herein relate to an electrical circuit, further including: a controller configured to charge the at least one capacitor with electric charge in response to the output voltage indicating that the integrated voltage exceeds the reference voltage.

In some examples, the techniques described herein relate to an electrical circuit, wherein, in response to the output voltage indicating that the integrated voltage exceeds the reference voltage, the controller causes electric charge to flow from a battery that is housed within the gun to the energy store so as to charge the energy store.

In some examples, the techniques described herein relate to an electrical circuit, further including: an electric element that is configured to displace an actuator in response to electric current being directed into the electric element.

In some examples, the techniques described herein relate to an electrical circuit, wherein the electric element includes a solenoid or a piezoelectric element.

In some examples, the techniques described herein relate to an electrical circuit, wherein displacing the actuator causes the gun to fire a projectile.

In some examples, the techniques described herein relate to an electrical circuit, wherein the integrated voltage is proportional to the electric current.

In some examples, the techniques described herein relate to an electrical circuit, further including: a current sensing circuit, wherein the current sensing circuit includes: a current sense resistor; a current sense amplifier; a first pair of resistors having a first resistance; and a second pair of resistors having a second resistance different than the first resistance.

In some examples, the techniques described herein relate to an electrical circuit, wherein the current sense resistor produces a first voltage, and wherein the current sensing circuit produces a second voltage corresponding to the first voltage multiplied by the first resistance divided by the second resistance.

In some examples, the techniques described herein relate to an electrical circuit, wherein the current sense resistor includes a low-side resistor.

In some examples, the techniques described herein relate to an electrical circuit, wherein the current sense resistor includes a high-side resistor.

In some examples, the techniques described herein relate to an electrical circuit, wherein an output terminal of the current sensing circuit is coupled with an input terminal of the integrator circuit.

In some examples, the techniques described herein relate to an electrical circuit, wherein a resistance of the current sense resistor is 100,000 ohms, 200,000 ohms, or anywhere in between.

In some examples, the techniques described herein relate to an electrical circuit, further including: a reference voltage circuit, wherein the reference voltage is received based on the reference voltage circuit generating the reference voltage.

In some examples, the techniques described herein relate to an electrical circuit, wherein the reference voltage includes a threshold reference voltage that is inclusively between 0.25 volts and 5 volts.

In some examples, the techniques described herein relate to an electrical circuit, wherein the reference voltage circuit includes a configurable mixed signal integrated circuit, a voltage divider, or a diode drop.

In some examples, the techniques described herein relate to an electrical circuit, further including: a timer circuit configured to measure a duration of time, wherein the integrator circuit is configured to integrate the sensed voltage for the duration of time.

In some examples, the techniques described herein relate to an electrical circuit, wherein the duration of time includes a time threshold that is inclusively between 10 milliseconds and 250 milliseconds.

In some examples, the techniques described herein relate to an electrical circuit, wherein the output voltage indicates that the integrated voltage is greater than the reference voltage, and wherein the gun is configured to recharge the energy store based on the integrated voltage being greater than the reference voltage.

In some examples, the techniques described herein relate to an electrical circuit, wherein the output voltage indicates that the reference voltage is greater than the integrated voltage, and wherein the gun is configured to prevent the energy store from being recharged based on the reference voltage being greater than the integrated voltage.

In some examples, the techniques described herein relate to a method of monitoring discharge of electric charge within a gun, the method including: directing electric current from a capacitor bank including a plurality of capacitors through a solenoid while a first group of capacitors of the plurality of capacitors is coupled in series with a second group of capacitors of the plurality of capacitors; producing a first voltage based on the electric current and an amplifier circuit configured to amplify current induced voltages; producing a second voltage based on a configurable mixed signal circuit that is configured to produce voltages; and generating, based on comparing the first voltage against the second voltage, an output voltage indicating whether a voltage condition is satisfied, wherein the voltage condition is satisfied when a threshold amount of electric charge is transferred though the solenoid so as to cause displacement of an actuator that is located proximate to the solenoid.

In some examples, the techniques described herein relate to a method, wherein transferring the threshold amount of electric charge through the solenoid causes displacement of a sear, displacement of a firing pin, and propulsion of a bullet through a barrel of the gun.

In some examples, the techniques described herein relate to a method of monitoring discharge of electric charge, the method including: generating an integrated voltage using an integrator to integrate a current induced voltage that is present across a resistor; comparing the integrated voltage against a reference voltage to determine whether the integrated voltage exceeds the reference voltage, wherein the reference voltage corresponds to a threshold amount of electric charge; and generating, based on the comparing the integrated voltage against the reference voltage, an output voltage that indicates whether the integrated voltage exceeds the reference voltage.

In some examples, the techniques described herein relate to a method, further including: measuring a duration of time, wherein the output voltage that indicates whether the integrated voltage exceeds the reference voltage is generated within the duration of time.

In some examples, the techniques described herein relate to a method, further including: clearing a latch in response to the integrated voltage exceeding the reference voltage within a duration of time.

In some examples, the techniques described herein relate to a method, wherein the duration of time is inclusively between 10 milliseconds and 250 milliseconds.

In some examples, the techniques described herein relate to a method, further including: clearing a latch in response to the output voltage indicating that the integrated voltage exceeds the reference voltage.

In some examples, the techniques described herein relate to a method, wherein the reference voltage is inclusively between 0.25 volts and 5 volts.

In some examples, the techniques described herein relate to a method, wherein the clearing the latch is in response to the output voltage indicating that the integrated voltage exceeds the reference voltage within a duration of time.

In some examples, the techniques described herein relate to a method, wherein the reference voltage is generated using a programmable mixed signal integrated circuit, a voltage divider, or a diode drop.

In some examples, the techniques described herein relate to a method, wherein the integrated voltage is generated using high-side current sensing, low-side current sensing, inductive current sensing, or Hall effect current sensing.

In some examples, the techniques described herein relate to a method, further including: transferring a threshold amount of electric charge through a solenoid, wherein the reference voltage corresponds to the threshold amount of electric charge being transferred through the solenoid, wherein the transferring the threshold amount of electric charge through the solenoid causes displacement of an actuator that is located proximate to the solenoid.

In some examples, the techniques described herein relate to a method, wherein the transferring the threshold amount of electric charge through the solenoid results in a sear being released.

In some examples, the techniques described herein relate to a method, wherein the sear being released causes a firing pin to be released such that the firing pin collides with a cartridge primer cap.

In some examples, the techniques described herein relate to an electrical circuit for monitoring discharge of electric charge within a gun, the electrical circuit including: an energy store in which electric charge is stored; an integrator circuit that takes, as input, a first voltage signal indicative of an amount of the electric charge that is discharged from the energy store and produces, as output, a second voltage signal that is indicative of an integration of the first voltage signal; and a comparator circuit that takes, as input, the second voltage signal and a third voltage signal that serves as a reference voltage and produces, as output, a fourth voltage signal that indicates whether the second voltage signal exceeds the third voltage signal.

In some examples, the techniques described herein relate to a method performed by an electrical circuit that monitors discharge of electric charge within a gun, the method including: generating, by an integrator circuit of the electrical circuit, an integrated voltage; and generating, by a comparator circuit of the electrical circuit, an output voltage that indicates whether the integrated voltage exceeds the reference voltage.

REMARKS

The Detailed Description provided herein, in connection with the drawings, describes example configurations and does not represent all the examples that may be implemented or that are within the scope of the claims. The term "example" used herein means "serving as an illustration or instance," and not "a preferred example."

The functions described herein may be implemented with a controller. A controller may include a fire control manager, a special-purpose processor, a general-purpose processor, a digital signal processor (DSP), a CPU, a graphics processing unit (GPU), a microprocessor, a tensor processing unit (TPU), a neural processing unit (NPU), an image signal processor (ISP), a hardware security module (HSM), an ASIC, a programmable logic device (such as an FPGA), a state machine, a circuit (such as a circuit including discrete hardware components, analog components, or digital components), or any combination thereof. Some aspects of a controller may be programmable, while other aspects of a control may not be programmable. In some examples, a digital component of a controller may be programmable (such as a CPU), and in some other examples, an analog component of a controller may not be programmable (such as a differential amplifier).

In some cases, instructions or code for the functions described herein may be stored on or transmitted over a computer-readable medium, and components implementing the functions may be physically located at various locations. Computer-readable media includes both non-transitory computer storage media and communication media. A non-transitory storage medium may be any available medium that may be accessed by a computer or component. For example, non-transitory computer-readable media may include RAM, SRAM, DRAM, ROM, EEPROM, flash memory, magnetic storage devices, or any other non-transitory medium that may be used to carry and/or store program code means in the form of instructions and/or data structures. The instructions and/or data structures may be accessed by a special-purpose processor, a general-purpose processor, a manager, or a controller. A computer-readable media may include any combination of the above, and a compute component may include computer-readable media.

In the context of the specification, the term "left" means the left side of the gun when the gun is held in an upright position, where the term "upright position" generally refers to a scenario in which the gun is oriented as if in a high-ready position with the barrel roughly parallel to the ground. The term "right" means the right side of the gun when the gun is held in the upright position. The term "front" means the muzzle end (also referred to as the "distal end") of the gun, and the term "back" means the grip end (also referred to as the "proximal end") of the gun. The terms "top" and "bottom" mean the top and bottom of the gun as the gun is held in the upright position. The relative positioning terms such as "left," "right," "front," and "rear" are used to describe the relative position of components. The relative positioning terms are not intended to be limiting relative to a gravitational orientation, as the relative positioning terms are intended to be understood in relation to other components of the gun, in the context of the drawings, or in the context of the upright position described above.

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling those skilled in the relevant art to understand the claimed subject matter, the various embodiments, and the various modifications that are suited to the particular uses contemplated.

Although the Detailed Description describes certain embodiments and the best mode contemplated, the technology can be practiced in many ways no matter how detailed the Detailed Description appears. Embodiments may vary considerably in their implementation details, while still being encompassed by the specification. Particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments.

The language used in the specification has been principally selected for readability and instructional purposes. It may not have been selected to delineate or circumscribe the subject matter. It is therefore intended that the scope of the technology be limited not by this Detailed Description, but rather by any claims that issue on an application based hereon. Accordingly, the disclosure of various embodiments is intended to be illustrative, but not limiting, of the scope of the technology as set forth in the following claims.

What is claimed is:

1. An electrical circuit for monitoring discharge of electric charge within a gun, the electrical circuit comprising:
   an energy store comprising at least one capacitor, wherein the energy store is configured to selectively discharge electric charge;
   an integrator circuit that is electronically coupled with the energy store, wherein the integrator circuit is configured to integrate a sensed voltage and produce an integrated voltage as output, wherein the integrated voltage indicates an amount of transferred electric charge; and
   a comparator circuit configured to receive (i) the integrated voltage and (ii) a reference voltage as inputs and produce an output voltage indicating whether the integrated voltage exceeds the reference voltage.

2. The electrical circuit of claim 1, further comprising:
   a controller configured to charge the at least one capacitor with electric charge in response to the output voltage indicating that the integrated voltage exceeds the reference voltage.

3. The electrical circuit of claim 2, wherein, in response to the output voltage indicating that the integrated voltage exceeds the reference voltage, the controller causes electric charge to flow from a battery that is housed within the gun to the energy store so as to charge the energy store.

4. The electrical circuit of claim 1, further comprising:
   an electric element that is configured to displace an actuator in response to electric current being directed into the electric element.

5. The electrical circuit of claim 4, wherein the electric element comprises a solenoid or a piezoelectric element.

6. The electrical circuit of claim 4, wherein displacing the actuator causes the gun to fire a projectile.

7. The electrical circuit of claim 4, wherein the integrated voltage is proportional to the electric current.

8. The electrical circuit of claim 1, further comprising:
   a current sensing circuit, wherein the current sensing circuit includes:
      a current sense resistor;
      a current sense amplifier;
      a first pair of resistors having a first resistance; and
      a second pair of resistors having a second resistance different than the first resistance.

9. The electrical circuit of claim 8, wherein the current sense resistor produces a first voltage, and wherein the current sensing circuit produces a second voltage corresponding to the first voltage multiplied by the first resistance divided by the second resistance.

10. The electrical circuit of claim 9, wherein the current sense resistor comprises a low-side resistor.

11. The electrical circuit of claim 9, wherein the current sense resistor comprises a high-side resistor.

12. The electrical circuit of claim 9, wherein an output terminal of the current sensing circuit is coupled with an input terminal of the integrator circuit.

13. The electrical circuit of claim 9, wherein a resistance of the current sense resistor is 100,000 ohms, 200,000 ohms, or anywhere in between.

14. The electrical circuit of claim 1, further comprising:
   a reference voltage circuit, wherein the reference voltage is received based on the reference voltage circuit generating the reference voltage.

15. The electrical circuit of claim 14, wherein the reference voltage comprises a threshold reference voltage that is inclusively between 0.25 volts and 5 volts.

16. The electrical circuit of claim 14, wherein the reference voltage circuit comprises a configurable mixed signal integrated circuit, a voltage divider, or a diode drop.

17. The electrical circuit of claim 1, further comprising:
a timer circuit configured to measure a duration of time, wherein the integrator circuit is configured to integrate the sensed voltage for the duration of time.

18. The electrical circuit of claim 17, wherein the duration of time comprises a time threshold that is inclusively between 10 milliseconds and 250 milliseconds.

19. The electrical circuit of claim 1, wherein the output voltage indicates that the integrated voltage is greater than the reference voltage, and wherein the gun is configured to recharge the energy store based on the integrated voltage being greater than the reference voltage.

20. The electrical circuit of claim 1, wherein the output voltage indicates that the reference voltage is greater than the integrated voltage, and wherein the gun is configured to prevent the energy store from being recharged based on the reference voltage being greater than the integrated voltage.

21. A method of monitoring discharge of electric charge within a gun, the method comprising:

directing electric current from a capacitor bank comprising a plurality of capacitors through a solenoid while a first group of capacitors of the plurality of capacitors is coupled in series with a second group of capacitors of the plurality of capacitors;

producing a first voltage based on the electric current and an amplifier circuit configured to amplify current induced voltages;

producing a second voltage based on a configurable mixed signal circuit that is configured to produce voltages; and generating, based on comparing the first voltage against the second voltage, an output voltage indicating whether a voltage condition is satisfied, wherein the voltage condition is satisfied when a threshold amount of electric charge is transferred though the solenoid so as to cause displacement of an actuator that is located proximate to the solenoid.

22. The method of claim 21, wherein transferring the threshold amount of electric charge through the solenoid causes displacement of a sear, displacement of a firing pin, and propulsion of a bullet through a barrel of the gun.

* * * * *